United States Patent
Secatch

(10) Patent No.: US 7,797,598 B1
(45) Date of Patent: Sep. 14, 2010

(54) DYNAMIC TIMER FOR TESTBENCH INTERFACE SYNCHRONIZATION

(75) Inventor: Stacey Secatch, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 974 days.

(21) Appl. No.: 11/599,112

(22) Filed: Nov. 14, 2006

(51) Int. Cl.
*G01R 31/3177* (2006.01)
*G01R 31/30* (2006.01)

(52) U.S. Cl. .................................. 714/724; 714/735
(58) Field of Classification Search .............. None
See application file for complete search history.

(56) References Cited

U.S. PATENT DOCUMENTS

| | | | | |
|---|---|---|---|---|
| 5,043,723 A | * | 8/1991 | Araki et al. | 340/825.69 |
| 5,581,510 A | * | 12/1996 | Furusho et al. | 365/201 |
| 6,901,496 B1 | * | 5/2005 | Mukund et al. | 711/169 |
| 7,284,237 B2 | * | 10/2007 | Blumenthal et al. | 717/124 |
| 7,395,169 B2 | * | 7/2008 | Vonstaudt | 702/117 |
| 2004/0049596 A1 | * | 3/2004 | Schuehler et al. | 709/238 |

* cited by examiner

*Primary Examiner*—Kevin L Ellis
*Assistant Examiner*—Dipakkumar Gandhi
(74) *Attorney, Agent, or Firm*—Kevin T. Cuenot; LeRoy D. Maunu; Lois D. Cartier

(57) ABSTRACT

A method of evaluating a design under test (DUT) can include executing a testbench involving the DUT and, during execution of the testbench, estimating an amount of time needed to perform a first transaction with the device under test according to resolved variables. The method also can include setting a timer with the estimated amount of time needed to perform the first transaction and invoking the first transaction with the device under test. Responsive to expiration of the timer, an indication as to whether the first transaction completed execution can be provided.

11 Claims, 5 Drawing Sheets

```
1    localparam status_cycles_check    = 1;
2    localparam tb_period              = 10ns;
3
4    int max_packet_written_to_date;
5    int run_cycles;
6
7    task write_one_randompacket();
8            size = $random();
9            if (size > max_packet_written_to_date) begin
10                   max_packet_written_to_date = size;
11           end
12           run_cycles += size * write_period_multiplier;
13           tb.write_one_random_packet(size);
14   endtask
15
16   task read_one_random_packet();
17           run_cycles += max_packet_written_to_date * read_period_multiplier;
18           tb.read_one_random_packet();
19   end
20
21   task check_status_size_packet();
22           run_cycles += status_cycles_check * read_period_multiplier;
23           tb.check_status_size_packet();
24   endtask
25
26   task watchdog_timer();
27           # (run_cycles * tb_period);
28           run_cycles = 0;
29   endtask
```

FIG. 1

FIG. 2
```
1    task one_packet_overlapping();
2         write_one_random_size_packet();
3         read_one_random_size_packet();
4         watchdog_timer();
5         check_all_modules_complete();
6    endtask
```
FIG. 3
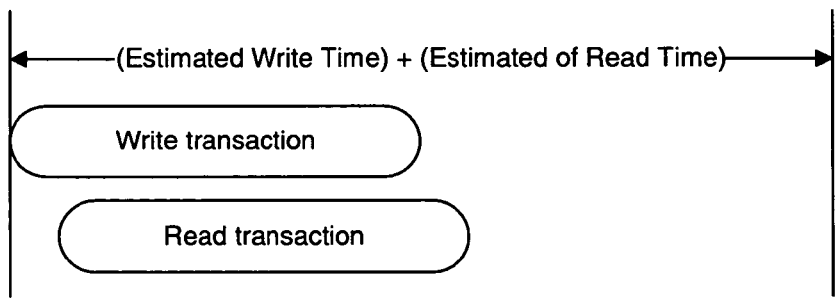
FIG. 4
```
1    task one_packet_in_sequence();
2         write_one_random_size_packet();
3         watchdog_timer();
4         read_one_random_size_packet();
5         watchdog_timer();
6         check_all_modules_complete();
7    endtask
```
FIG. 5
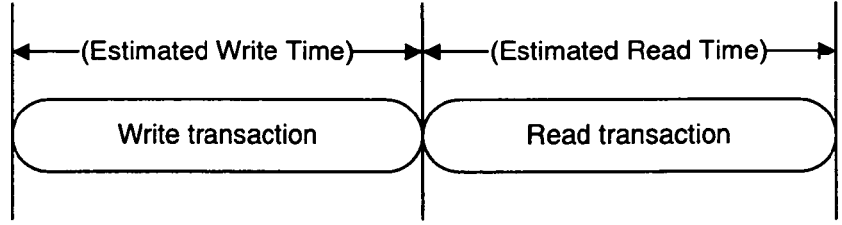

FIG. 6

```
1    localparam read_latency = 10 * read_period_multiplier;
2    task one_packet_overlapping();
3        int current_run_cycles;
4        write_one_random_size_packet();
5        current_run_cycles = run_cycles;
6        read_one_random_size_packet();
7        run_cycles = current_run_cycles + read_latency;
8        watchdog_timer();
9        check_all_modules_complete();
10   endtask
```

FIG. 7

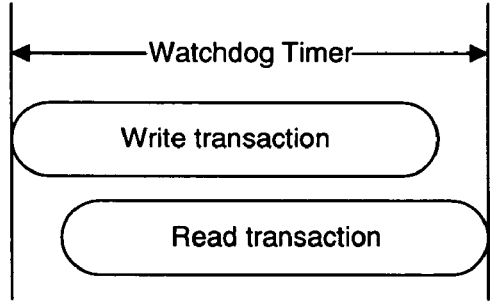

FIG. 8

```
1    localparam loop_size = 1000;
2    task watchdog_timer();
3        int loops = (run_cycles + loop_size-1)/loop_size;
4        for (int i = 0; i c loops; i++) begin
5            # (tb_period*loop_size)
6            if (check_all_modules_idle() == 1) begin
7                return;
8            end
9        end
10   endtask
```

```
1   logic [str_len*8-1:0] segment;
2   task watchdog_timer(logic [str_len*8-1:0] echo_str);
    ...
3   $display("executing %0s", echo_str);
4   segment = echo_str;
    ...
```

DYNAMIC TIMER FOR TESTBENCH INTERFACE SYNCHRONIZATION

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to the simulation of circuit designs and, more particularly, to the utilization of timers for simulation interface synchronization and timeout error detection.

BACKGROUND

A testbench, also referred to as a verification environment, refers to hardware description language (HDL) and/or hardware verification language (HVL) descriptions that specify and verify the behavior of a device under test (DUT), for example an IP (intellectual property) core or other circuit design. Generating a testbench involves describing the connections, events, and test vectors for different combinations of transactions involving the DUT. A testbench also refers to the code used to create a pre-determined input sequence to the DUT, as well as the code responsible for observing the response from the DUT.

Within a testbench, a watchdog timer is a standard mechanism for terminating a given test. If the watchdog timer times out, the test is terminated, as a timeout condition is indicative of an error condition or failure. The watchdog timer usually is loaded with a value that provides much more time than is needed for the test to complete, e.g., a value that is typically on the order of 10 times the time needed for the test to complete execution. Thus, if the test does not complete execution prior to the timeout condition, it is likely that a significant problem has occurred in testing the DUT. In other words, a timeout of the watchdog timer is an unwanted condition that is indicative of a significant problem with the DUT.

The time value that is loaded into the watchdog timer is a set value. While the value can be specified as a variable, it nonetheless is fixed. Utilizing a fixed value for the watchdog timer can introduce a significant amount of overhead into the DUT evaluation process. The watchdog timer, as noted, is loaded with a time value that far exceeds the time needed for even the most time consuming test to execute. When randomization is introduced into the testbench, the inefficiencies of watchdog timers can be further exacerbated.

For example, randomization may result in one test case completing execution in a small amount of time while another test case requires a much larger amount of time. Conventional systems load the watchdog timer with the same large, conservative value for both test cases. If an error occurs during the shorter duration test case, the testbench still waits until the watchdog timer expires before determining that an error has, in fact, occurred. The time between the occurrence of the error and the expiration of the watchdog timer is effectively wasted time.

Another layer of complexity is that testbenches often operate upon complex DUTs that incorporate several unrelated interfaces. In general, an interface refers to a collection of signals. A testbench interface tests the collection of signals, i.e., provides a mechanism for determining values for such signals at a given time during simulation. Interfaces can be said to be unrelated where, for example, each interface has an asynchronous clock and the interfaces are not synchronized except for the testbench having to access the interfaces, perhaps at a same specified time during simulation. With this in mind, it becomes necessary to execute some transactions in sequential fashion and others concurrently to adequately test a complex DUT.

It would be beneficial to implement a system that addresses the deficiencies described above.

SUMMARY OF THE INVENTION

The present invention relates to the use of a watchdog timer within a testing environment and to determining more accurate values for use with the watchdog timer. One embodiment of the present invention can include a method of evaluating a design under test (DUT) including executing a testcase involving the DUT and, at runtime of the testcase, estimating an amount of time needed to perform a first transaction with the DUT according to resolved variables. The method can include setting a timer with the estimated amount of time needed to perform the first transaction and invoking the first transaction with the DUT. Responsive to expiration of the timer, an indication as to whether the first transaction completed execution can be provided. In one embodiment, indicating whether the transaction completed execution can include checking whether each module of the DUT is idle.

If the first transaction is a write transaction, estimating the amount of time needed to perform the first transaction can include determining the size of a packet to be written to the DUT and calculating the estimated amount of time to perform the first transaction according to the size of the packet. If the first transaction is a read transaction, estimating the amount of time needed to perform the first transaction can include identifying a largest packet that has been written to the DUT during at least a portion of the execution of the testcase, determining a size of the largest packet, and calculating the estimated amount of time to perform the first transaction according to the size of the largest packet.

The method also can include estimating an amount of time needed to perform a second transaction with the DUT, wherein the first transaction and second transaction are performed sequentially, setting the timer with the estimated amount of time needed to perform the second transaction, invoking the second transaction with the DUT, and responsive to expiration of the timer, indicating whether the second transaction completed execution.

During operation of the timer, a check can be performed at least one time to determine whether modules of the DUT are idle. If the modules are idle, the timer can be exited.

The method also can include providing a visual indication of which of a plurality of transactions is executing.

Another embodiment of the present invention can include a method of evaluating a DUT including executing a testcase for the DUT and, at runtime of the testcase, estimating an amount of time needed to perform a plurality of overlapping transactions with the DUT according to resolved variables. The method can include setting a timer with the estimated amount of time, invoking the plurality of transactions with the DUT, and, responsive to expiration of the timer, indicating whether the plurality of transactions completed execution. In one embodiment, the method can include, during operation of the timer, checking at least one time to determine whether modules of the DUT are idle and, if so, exiting the timer.

In another embodiment, estimating the amount of time needed can include estimating an amount of time needed to perform each one of the plurality of transactions and summing the estimates to determine the amount of time needed to perform the plurality of transactions. If at least one of the plurality of transactions is a write transaction, estimating the amount of time needed can include determining a size of packet to be written to the DUT during the write transaction and calculating an estimate for completing execution of the write transaction according to the size of the packet. If at least one of the plurality of transactions is a read transaction, estimating the amount of time needed can include identifying a largest packet that has been written to the DUT during execution of at least a portion of the testcase, determining a size of the largest packet, and calculating an estimate for completing execution of the read transaction according to the size of the largest packet.

Yet another embodiment of the present invention can include a machine readable storage, having stored thereon a computer program having a plurality of code sections for causing a machine to perform the various steps and functions disclosed herein.

BRIEF DESCRIPTION OF THE DRAWINGS

There are shown in the drawings, embodiments which are presently preferred, it being understood; however, that the invention is not limited to the precise arrangements and instrumentalities shown.

FIG. 1 is a listing of source code which is useful for understanding one embodiment of the present invention.

FIG. 2 is a listing of source code which is useful for understanding another embodiment of the present invention.

FIG. 3 is a timing diagram illustrating the transactions initiated from the source code of FIG. 2.

FIG. 4 is a listing of source code which is useful for understanding another embodiment of the present invention.

FIG. 5 is a timing diagram illustrating the transactions initiated from the source code of FIG. 4.

FIG. 6 is a listing of source code which is useful for understanding another embodiment of the present invention.

FIG. 7 is a timing diagram illustrating the transactions initiated from the source code of FIG. 6.

FIG. 8 is a listing of source code which is useful for understanding yet another embodiment of the present invention.

DETAILED DESCRIPTION OF THE INVENTION

Figure 9:
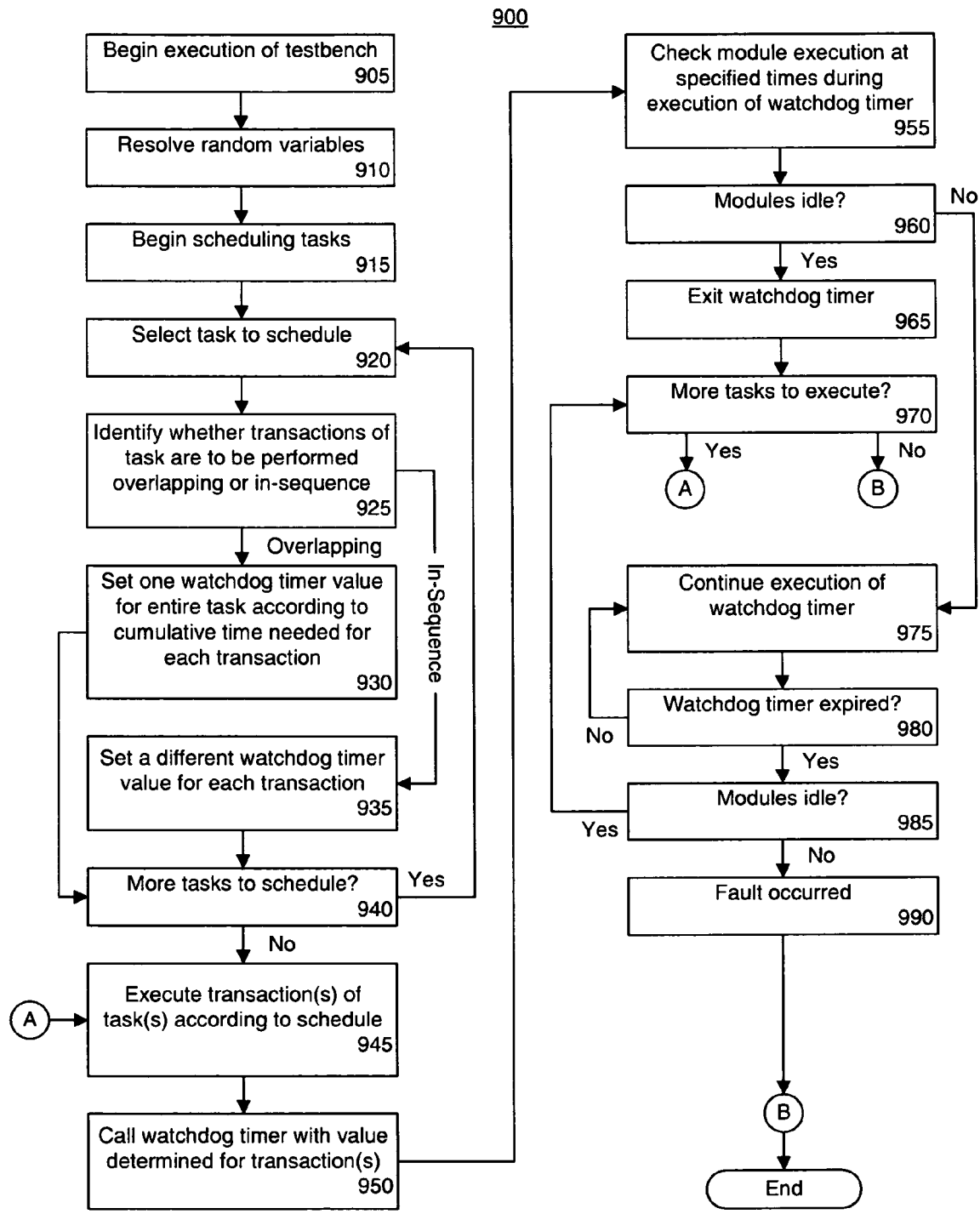
FIG. 9 is a flow chart illustrating a method of utilizing a watchdog timer within a test environment in accordance with another embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to a watchdog timer for use with a test environment in which a device under test (DUT) is being evaluated. More particularly, at runtime of the testbench, an estimate of the time needed to perform one or more transactions with the DUT can be performed. The watchdog timer set to monitor the transaction(s) can be loaded with the estimated time needed for the transaction(s) to complete execution. Values loaded into the watchdog timer are derived from estimates of the time needed to perform the actual transactions to be executed. In this manner, the watchdog timer is loaded with a time that is more reflective of the actual simulation time needed to perform the monitored transaction rather than loaded with an excessively large amount of time that is not correlated with the actual transactions being performed.

In accordance with the embodiments disclosed herein, the watchdog timer also is structured such that the timer is intended to timeout. Conventional implementations of the watchdog timer are configured such that a timeout condition is indicative of a failure. The embodiments disclosed herein structure the watchdog timer such that timeouts are expected, possibly multiple times, within a given test. When the watchdog timer times out, the modules of the DUT are evaluated to determine whether execution of the monitored transaction has finished.

FIG. 1 is a listing of source code which is useful for understanding one embodiment of the present invention. For purposes of illustration, the source code depicted in FIG. 1 is written using a hardware description language (HDL) such as Verilog. It should be appreciated, however, that other HDLs, such as VHDL, as well as hardware verification languages (HVLs), such as SystemVerilog or Vera, also can be used. Accordingly, the embodiments disclosed herein are not intended to be limited by the particular programming language, HDL, or HVL used.

The source code of FIG. 1, illustrates an embodiment of the present invention in which more accurate estimates of the time needed for a transaction to complete execution are used to load the watchdog timer. As shown, lines 1-2 of the source code define constants used to control test operation. Lines 4-5 define global variables that can be used to control time calculations. Lines 7-14 define a write transaction in which a random sized packet is written to the DUT. Lines 16-19 define a read transaction in which a random sized packet is read from the DUT. Lines 21-24 define a status check transaction. Finally, lines 26-29 define a watchdog timer function that is dependent upon a "run_cycles" global variable.

At runtime of the testbench, the random variables are resolved. Accordingly, for particular transactions, e.g., a write transaction, the size of packet or data involved in the transaction with the DUT becomes known at runtime. Once the size of the packet involved in the transaction is known, a more accurate estimate of the time needed for that transaction to occur can be determined. In one embodiment, as will be described in further detail, each of the transactions to be performed sets some value for the "run_cycles" global variable. The "run_cycles" global variable can be used to load the watchdog timer with a particular value that is, effectively, customized according to the particular transaction(s) with which the watchdog timer is associated, or monitoring. As shown, the "run_cycles" variable can be calculated according to the resolved random variable, which in this case indicates packet size, and an adjustment parameter, in this case a factor, which can be transaction specific.

While the time needed to execute some transactions, e.g., a write transaction and a status transaction, can be determined with a high degree of accuracy, the time needed to perform other transactions may not be easily determined. The time needed to perform these transactions, or any uncertainty relating to the time needed, stems from the random testbench support in which quantities, such as the size of packets to be read or written, is not determined or resolved until runtime. Consider the case in which the DUT provides buffering of packet-based data from multiple input streams and aggregation into a single output interface. The Xilinx LogiCORE™ Packet Queue available from Xilinx, Inc. of San Jose, Calif. is one example of such a device. In that case, when a packet is to be read from the DUT, the size of the packet being read is not known until the read transaction completes. Accordingly, for a read transaction, another mechanism must be used to determine the value of the watchdog timer to monitor such transactions.

In one embodiment of the present invention, the size of packets written to the DUT can be tracked. The testbench can store the size of the largest packet written during the test, e.g., in the "max_packet_written_to_date" variable. This is illustrated in lines 9-11 of FIG. 1. Though the particular packet, and therefore the size of that packet, being read from the DUT may not be known, it can be assumed that the packet cannot be any larger than the largest packet that has been written to the DUT during the course of the test. Thus, for a read transaction, the watchdog timer can be set to a value which depends upon the largest size packet that has been written to the DUT during the test. The read transaction sets the "run_cycles" global variable according to "max_packet_written_to_date" that indicates the largest size packet written thus far. This is illustrated at line 17 of FIG. 1. As shown, an adjustment parameter also can be used. It should be appreciated that the maximum packet size written to date can be monitored for the testcase as a whole or for various segments of the testcase, in which case the "max_packet_written_to_date" variable can be initialized prior to the test flow continuing.

FIG. 2 is a listing of source code which is useful for understanding another embodiment of the present invention. The source code of FIG. 2 effectively causes a write transaction and a read transaction to be performed in an overlapping fashion, i.e., where at least a portion of the two transactions occurs concurrently. In that case, one watchdog timer can be used to monitor both transactions. In this case, the estimated time needed for the write transaction to execute can be added to the watchdog timer and the write transaction can be scheduled. Next, the estimated time for the read transaction to execute can be added to the watchdog timer and the read transaction can be scheduled.

The watchdog timer can be loaded with a value that is reflective of estimates of the time needed for each transaction to complete execution. More particularly, an estimate of the time needed for the write transaction to execute can be performed. An estimate of the time needed for a read transaction to execute also can be performed. The two estimates can be summed and used to set the watchdog timer, possibly using some other factor(s) to adjust for simulation time as described. The transactions are executed and the watchdog timer is set with the appropriate time. Upon expiration of the timer, the modules of the DUT are checked to ensure that the transactions completed execution. The modules can be checked to ensure that each is in an idle state indicating that no transactions are being executed.

Read and write transactions have been shown and used throughout the specification for purposes of illustration only. It should be appreciated, however, that other transactions including, but not limited to, control or query transactions, also are supported and may be utilized with the embodiments described herein.

FIG. 3 is a timing diagram illustrating the transactions initiated from the source code of FIG. 2. The length of each transaction is indicative of the time required for that transaction to complete execution. As shown, the write transaction and the read transaction are performed in an overlapping manner. That is, the read transaction begins before the write transaction has competed execution. The watchdog timer has been loaded with a time that is the sum of the estimated time for each transaction to execute. While the watchdog timer may be loaded with a time that is larger than necessary, the overhead is reduced. The value loaded into the watchdog timer is based upon an estimate of the actual simulation time needed to execute both transactions. This typically will be less than the conventional situation in which each transaction is assumed to require a "worst case amount of time" to execute and those two estimates are summed.

FIG. 4 is a listing of source code which is useful for understanding another embodiment of the present invention. The source code of FIG. 4 causes a write transaction and a read transaction to occur in sequential fashion. By using the watchdog timer multiple times, e.g., once for each transaction, sequential operation of commands can be ensured. Invoking the watchdog timer in this manner prevents one transaction, e.g., the read transaction, from beginning execution until the other, e.g., the write transaction, has finished. In this case, the watchdog timer is called with each transaction and is loaded with a value determined by estimating the simulation time needed to perform that transaction. At the conclusion of the task, the modules of the DUT again can be checked to determine whether each is idle.

FIG. 5 is a timing diagram illustrating the transactions initiated from the source code of FIG. 4. As shown, the write transaction and the read transaction are performed sequentially. In this case, the watchdog timer is loaded with a value corresponding to the write transaction and run. The watchdog timer is then loaded with a value corresponding to the read transaction and run. The total time, however, is the same as the time illustrated with reference to FIG. 3.

The embodiments disclosed herein allow the underlying module(s) which implement the user commands to be coded in a consistent manner. The individual test cases, however, can control whether user commands overlap as in the case of FIG. 3 or are sequentially ordered, as in the case of FIG. 5. The same user commands, e.g., transactions, can be implemented in either overlapping or sequential fashion. As discussed above, the time needed to perform either a sequential series of transactions or a set of overlapping transactions will be the same. The overlapping case, in principle, should require less time to execute than the sequential case, assuming the same transactions are being performed in each case.

FIG. 6 is a listing of source code which is useful for understanding another embodiment of the present invention. The source code of FIG. 6 illustrates an embodiment in which the "run_cycles" variable is global and values ascribed to the variable are overridden prior to calling the watchdog timer. Thus, in cases where the tester knows a more appropriate value to be used for the watchdog timer, values automatically determined for the watchdog timer in reference to transactions such as write_one_random_size_packet( ) and read_one_random_size_packet( ) can be overridden as shown in lines 5 and 7 of FIG. 6.

FIG. 7 is a timing diagram illustrating the transactions initiated from the source code of FIG. 6. As shown, the watchdog timer has been loaded with a time value that is sufficient to allow both the write transaction and the read transaction to execute in an overlapping manner. The time value used by the watchdog timer has been decreased. Reduction of the value loaded into the watchdog timer results in less wasted time in which the testbench is idle waiting for the watchdog timer to complete execution, despite the monitored transactions having completed execution many cycles prior. As shown, the watchdog timer expires at the conclusion of the execution of the transactions without excess time occurring between the end of the read transaction and the timer expiration.

FIG. 8 is a listing of source code which is useful for understanding yet another embodiment of the present invention. The source code listing of FIG. 8 illustrates another embodiment of a watchdog timer in which the additional simulation overhead can be eliminated in a more automated fashion. The source code of FIG. 8 illustrates an embodiment in which the watchdog timer waits for a portion of time and then checks to determine whether any more user commands are left to execute by the DUT. A check also can be performed to ensure that any previously issued commands have completed execution, e.g., the modules of the DUT are idle. If no further commands are to be processed and previously issued commands have completed execution, the DUT is synchronized on all interfaces and is idle. Accordingly, no further simulation time need be allocated for these commands. The system can exit out of the watchdog timer and continue with the test flow.

FIG. 9 is a flow chart illustrating a method 900 of utilizing a watchdog timer within a test environment in accordance with another embodiment of the present invention. The method 900 can be implemented by a computer system executing a simulation environment or testbench as described herein. The method 900 can begin in a state in which the testbench has been loaded with, or configured to evaluate, a DUT such as an IP core. In any case, the method 900 can begin in step 905 where the test flow can be executed by the testbench.

In step 910, after execution of the testbench begins, i.e., at runtime, random variables specified in the testbench can be resolved. In step 915, the testbench can begin scheduling the events for the test flow. Accordingly, in step 920, a task can be selected for scheduling. In step 925, a determination can be made as to whether the task to be executed is to be performed in an overlapping fashion or in-sequence. If performed in an overlapping fashion, the method can continue to step 930, where the time needed to complete execution of each of the transactions of the selected task can be estimated. The watchdog timer then can be loaded with the cumulative amount of time estimated for each transaction of the selected task. That is, the estimated time for each transaction of the task to complete execution can be summed for use with the watchdog timer in monitoring the transaction(s).

If the transactions are to be performed in-sequence, the method can continue from step 925 to step 935. In step 935, the time needed for each transaction of the selected task to complete execution can be estimated. In this case, rather than using a single invocation of the watchdog timer, the watchdog timer can be called for each transaction individually. Accordingly, on a per transaction basis, the estimated time for completion of a transaction can be used in the watchdog timer when the watchdog timer is called to monitor that particular transaction.

In step 940, a determination can be made as to whether any additional tasks of the testbench remain to be scheduled. If so, the method can loop back to step 920 and continue scheduling further tasks. If not, the method can proceed to step 945.

In step 945, the simulator can begin executing the various transactions of the tasks according to the schedule. Transactions of the task(s) scheduled for the current simulation time can begin executing, whether in sequential fashion or in overlapping fashion as determined through the scheduling process. In step 950, the watchdog timer can be called and loaded with the appropriate value determined in either of steps 930 or 935. As noted, if the watchdog timer is called to monitor execution of a plurality of overlapping transactions, a single watchdog timer can be called which is set for an amount of time that is equal to the sum of the estimates of the time needed for each of the overlapping transactions to complete execution individually. If the watchdog timer is called to monitor execution of one or more in-sequence transactions, the watchdog timer can be called one time for each transaction in a serial manner as described herein.

In step 955, in accordance with one embodiment of the present invention, the watchdog timer can be programmed to check or poll modules of the DUT to determine whether those modules are idle and, therefore, have completed execution of the scheduled transaction(s). This checking can be performed one or more times, for example on a periodic basis, during countdown of the watchdog timer.

In step 960, a determination can be made as to whether the modules of the DUT are idle. The watchdog timer further can determine whether additional transactions remain to be processed for the given task. If so, the method can proceed to step 965, where the testbench exits from the watchdog timer since each transaction of the monitored task has completed execution. In step 970, a determination can be made as to whether the any further tasks are to be executed. If so, the method can proceed to step 945 and continue processing further tasks. If not, the method can end as the test flow is finished.

Continuing with step 975, in the case where the modules polled in step 960 were not idle, execution of the watchdog timer can continue. In step 980, a determination can be made as to whether the watchdog timer has expired. If so, the method can proceed to step 985. If not, the method can loop back to step 975 to continue execution. It should be appreciated that, while not shown, the watchdog timer can further poll modules of the DUT while executing as was described with reference to step 955 on a periodic basis.

In any case, in step 985, a determination can be made as to whether the modules of the DUT are idle. If so, the method can proceed to step 965 and continue testing of the DUT. If not, since the watchdog timer has expired and one or more modules still are executing, a determination can be made that a fault has occurred in step 990. After step 990, the method can end. In another embodiment, if desired, the watchdog timer can be reloaded with an additional amount of time to continue monitoring for completion of the transactions. Reloading of the watchdog timer further can be iterated for a specified number of times if so desired.

It should be appreciated that the method 900 has been provided for purposes of illustration only and, as such, is not intended to limit the present invention in any way. For example, the ordering of steps may be changed without departing from the spirit of the invention. Further, method 900 presents a flow chart representing one possible arrangement incorporating the various embodiments disclosed herein, e.g., FIGS. 1-8. Accordingly, method 900 should not be construed as the only possible combination or arrangement of these features.

Figures 10, 11:
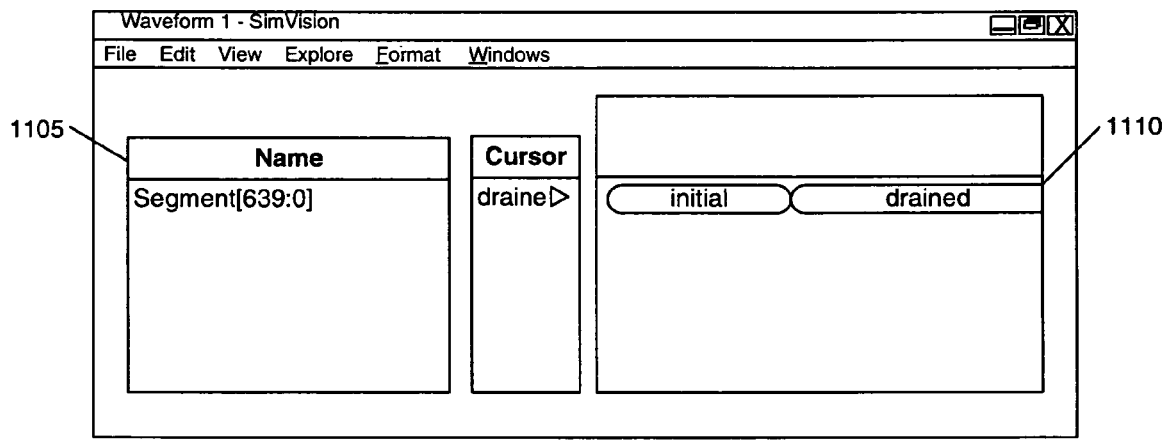
FIG. 10 is a listing of source code which is useful for understanding yet another embodiment of the present invention.
FIG. 11 is a graphical user interface illustrating the visualization of test flow information in accordance with another embodiment of the present invention.

FIG. 10 is a listing of source code which is useful for understanding yet another embodiment of the present invention. The source code of FIG. 10 illustrates an embodiment in which a string or other identifier is used in conjunction with the watchdog timer. The identifier can be provided as output, whether within a waveform viewer or as other output, to indicate or demarcate different test segments or transactions as simulation of the DUT progresses.

FIG. 11 is a graphical user interface (GUI) 1100 illustrating the visualization of test flow information in accordance with another embodiment of the present invention. As shown, the GUI 1100 includes a window 1105 which includes an identifier [639:0]. In this case, the identifier is a segment that indicates width. In any case, the identifier, or segment, corresponds to the portion of the test that is executing and causing output waveforms as shown in window 1110.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising. i.e., open language.

This invention can be embodied in other forms without departing from the spirit or essential attributes thereof. Accordingly, reference should be made to the following claims, rather than to the foregoing specification, as indicating the scope of the invention.

What is claimed is:

1. A method of evaluating a design under test, the method comprising:
   executing a testcase involving a device under test;
   wherein the testcase includes at least one variable;
   resolving a respective random value for the at least one variable of the testcase at runtime of the testcase;
   estimating, at runtime of the testcase, an amount of time needed to perform one or more transactions with the device under test, wherein the amount of time needed to perform the one or more transactions depends upon the respective random value resolved for the at least one variable;
   identifying whether a transaction task to be performed comprises overlapping transactions or in-sequence transactions, wherein the transaction task comprises the one or more transactions;
   setting a timer with the estimated amount of time needed to perform the one or more transactions;
   wherein setting the timer comprises:
      in response to the transaction task being in-sequence, setting the timer with a plurality of timer values sequentially, wherein each timer value corresponds to one of the in-sequence transactions, wherein the timer is reloaded with a next timer value for a next in-sequence transaction upon expiration until no further in-sequence transactions remain; and
      in response to the transaction task being overlapping, setting the timer with a single timer value according to a cumulative time needed for each of the overlapping transactions to complete;
   invoking the one or more transactions with the device under test;
   and
   indicating, responsive to expiration of the timer, whether the one or more transactions completed execution.

2. The method of claim 1, wherein indicating whether the one or more transactions completed execution further comprises checking whether each module of the device under test is idle.

3. The method of claim 1, wherein the one or more transactions include a write transaction, wherein estimating the amount of time needed to perform the one or more transactions comprises:
   determining a size of a packet to be written to the device under test from the respective random value of the at least one variable; and
   calculating the estimated amount of time to perform the one or more transactions according to the size of the packet.

4. The method of claim 1, wherein the one or more transactions is a read transaction, and wherein estimating the amount of time needed to perform the one or more transactions comprises:
   identifying a largest packet that has been written to the device under test during at least a portion of execution of the testcase;
   determining a size of the largest packet; and
   calculating the estimated amount of time to perform the one or more transactions according to the size of the largest packet.

5. The method of claim 1, further comprising providing a visual indication of which of a plurality of transactions is executing.

6. A machine readable non-transitory storage, having stored thereon a computer program having a plurality of code sections comprising:
   code for executing a testcase for a device under test, wherein the test case specifies at least one variable in the testcase;
   code for resolving a respective random value for the at least one variable of the testcase at runtime of the testcase;
   code for estimating, at runtime of the testcase, an amount of time needed to perform one or more transactions with the device under test, wherein the amount of time needed to perform the one or more transactions depends upon the respective random value resolved for the at least one variable;

code for identifying whether a transaction task to be performed comprises overlapping transactions or in-sequence transactions, wherein the transaction task comprises the at least one transaction;

code for setting a timer with the estimated amount of time needed to perform the one or more transactions;

wherein the code for setting the timer comprises:

code for setting, in response to the transaction task being in-sequence, the timer with a plurality of timer values sequentially, wherein each timer value corresponds to one of the in-sequence transactions, wherein the timer is reloaded with a next timer value for a next in-sequence transaction upon expiration until no further in-sequence transactions remain; and code for setting, in response to the transaction task being overlapping, the timer with a single timer value according to a cumulative time needed for each of the overlapping transactions to complete;

code for invoking the one or more transactions with the device under test; and code for indicating, responsive to expiration of the timer, whether the one or more transactions completed execution.

7. The machine readable non-transitory storage of claim 6, wherein the code for indicating whether the one or more transactions completed execution further comprises code for checking whether modules of the device under test are idle.

8. The machine readable non-transitory storage of claim 6, wherein the one or more transactions include a write transaction, and wherein the code for estimating the amount of time needed to perform the one or more transactions comprises:

code for determining a size of a packet to be written to the device under test; and code for calculating the estimate of the amount of time needed to perform the one or more transactions according to the size of the packet.

9. The machine readable non-transitory storage of claim 6, wherein the one or more transactions include a read transaction, and wherein the code for estimating the amount of time needed to perform the one or more transactions comprises:

code for identifying a largest packet that has been written to the device under test during execution of at least a portion of the test case;

code for determining a size of the largest packet; and code for calculating the estimate of the time needed to perform the one or more transactions according to a time needed to read the largest size packet.

10. The machine readable non-transitory storage of claim 6, further comprising code for providing a visual indication of which of a plurality of transactions is executing.

11. The machine readable non-transitory storage of claim 6, wherein the code for estimating the amount of time needed comprises:

code for estimating, in response to the transaction task being overlapping, an amount of time needed to perform each one of the one or more transactions; and code for summing the estimates to determine the cumulative time needed for the overlapping transactions.

\* \* \* \* \*